United States Patent [19]

Brahmbhatt et al.

[11] Patent Number: 4,910,471
[45] Date of Patent: Mar. 20, 1990

[54] CMOS RING OSCILLATOR HAVING FREQUENCY INDEPENDENT OF SUPPLY VOLTAGE

[75] Inventors: Dhaval J. Brahmbhatt, San Jose; Mehrdad Mofidi, Fremont, both of Calif.

[73] Assignee: ICT International CMOS Technology, Inc., San Jose, Calif.

[21] Appl. No.: 311,936

[22] Filed: Feb. 15, 1989

[51] Int. Cl.$^4$ ............................................. H03B 28/00
[52] U.S. Cl. .................................... 331/57; 331/108 A
[58] Field of Search ...................... 331/57, 108 A, 111, 331/176

[56] References Cited

U.S. PATENT DOCUMENTS 4,015,219 3/1977 Kawagoe et al. ................ 331/57 X

Primary Examiner—David Mis
Attorney, Agent, or Firm—Flehr, Hohbach, Test, Albritton & Herbert

[57] ABSTRACT

A CMOS ring oscillator includes an odd number of serially connected inverter stages with each stage comprising a CMOS transistor pair. The output of each stage is taken at the common terminal of the CMOS transistor pair with capacitive means shunting the output of each stage to circuit ground. The input of each stage is applied at the gate of the p-channel transistor. A fixed reference voltage, $V_{REF}$, is applied to the gate of each n-channel transistor, whereby the discharge of voltage on the capacitive means through the n-channel transistor is independent of supply voltage.

7 Claims, 1 Drawing Sheet

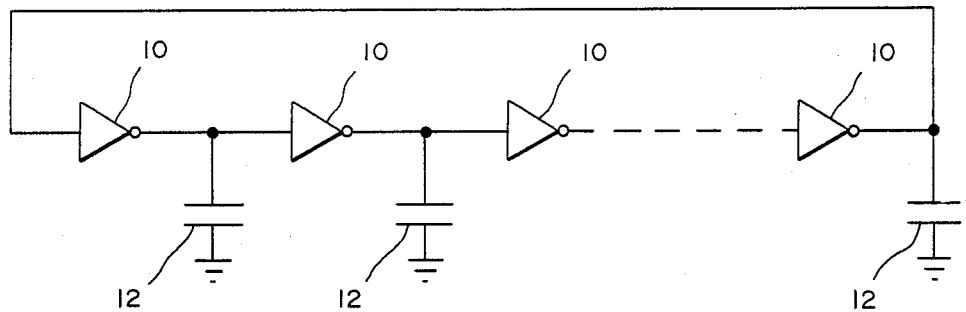
(PRIOR ART)
FIG.—1
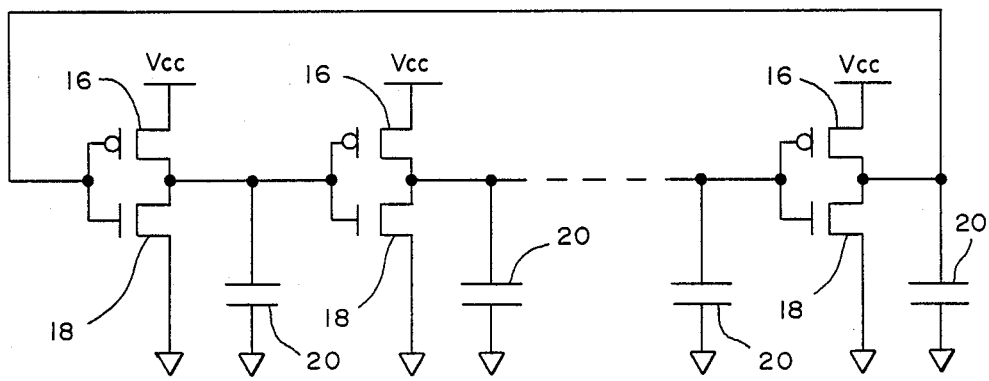
(PRIOR ART)
FIG.—2
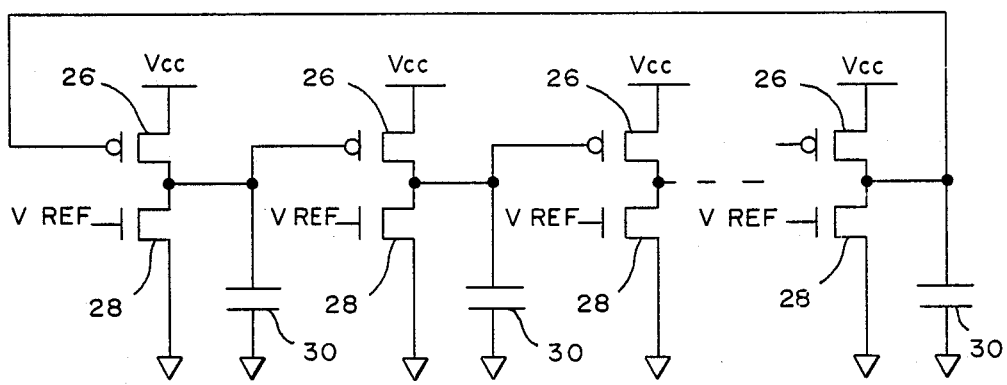
FIG.—3

CMOS RING OSCILLATOR HAVING FREQUENCY INDEPENDENT OF SUPPLY VOLTAGE

BACKGROUND OF THE INVENTION

This invention relates generally to a ring oscillator in which oscillation frequency is relatively independent of supply voltage.

The conventional ring oscillator comprises an odd number of inverter stages serially connected in a ring. In a conventional CMOS transistor ring oscillator, each stage comprises a p-channel transistor and an n-channel transistor pair serially connected between first and second voltage potentials, typically a positive supply voltage and ground. The common terminal of the transistors is the output of the stage and is connected to the gates of the succeeding transistor pair. Capacitive means shunts the output terminal to ground.

This circuit configuration makes the frequency of the oscillator dependent not only on the number of stages in the ring, but also on the supply voltage, $V_{CC}$, for the circuit. As $V_{CC}$ increases, the frequency of oscillation increases; conversely as $V_{CC}$ decreases, the frequency of oscillation decreases.

SUMMARY OF THE INVENTION

An object of the present invention is a CMOS ring oscillator in which frequency of oscillation is relatively independent of supply voltage.

A feature of the invention is the use of a reference voltage independent of $V_{CC}$ for the gate bias of the n-channel transistor in each CMOS transistor pair.

Briefly, in accordance with the invention, a plurality of stages, each comprising a CMOS transistor pair, are connected in a ring configuration with each transistor pair being serially connected between a first voltage potential, $V_{CC}$, and a second voltage potential, ground. The common terminal cf the transistor pair is connected to the gate terminal of the p-channel transistor in the succeeding transistor pair. A fixed reference voltage is applied to the gate of the n-channel transistor in each transistor pair. Capacitive means connects each output terminal of the transistor pair to ground. The p-channel transistor in a transistor pair becomes conductive when the voltage on the capacitance of the preceding stage discharges through the n-channel transistor of the preceding stage by the turn-on voltage of the transistor, $V_T$. Importantly, the fixed reference voltage on the gates of the n-channel transistors makes the $V_T$ discharge of the capacitor independent of $V_{CC}$.

The invention and objects and features thereof will be more readily apparent from the following detailed description and appended claims when taken with the drawing.

BRIEF DESCRIPTION OF THE DRAWINGS

FIG. 1 is a schematic of a conventional ring oscillator having an odd number of serially connected inverters.

FIG. 2 is a schematic of a conventional ring oscillator fabricated using CMOS transistor pairs.

FIG. 3 is a schematic of a ring oscillator fabricated using CMOS transistor pairs in accordance with the invention.

DETAILED DESCRIPTION OF ILLUSTRATIVE EMBODIMENTS

Referring now to FIG. 1, a ring oscillator comprising a plurality of serially connected inverter circuits 10 is illustrated. Each inverter 10 comprises one stage of the ring oscillator, with the ring oscillator having an odd number of stages, thereby providing an inherent instability of the circuit whereby the stages sequentially change state. Capacitive means 12 is associated with the output of each stage which provides a delay in the changing of states between sequential stages.

FIG. 2 is a schematic of a conventional ring oscillator of the configuration of FIG. 1 in which each stage comprises a CMOS transistor pair. As illustrated, each stage includes a p-channel transistor 16 serially connected with an n-channel transistor 18 between the supply voltage, $+V_{CC}$, and circuit ground. In the conventional CMOS ring oscillator, the gates of the two transistors in each stage are connected to the output of the preceding stage taken at the common terminal of the two serially connected transistors. A capacitor 20 shunts the output of each stage to circuit ground.

It is seen that the application of a "zero" (e.g. ground) to the input of one stage causes conduction of the p-channel transistor 16, thereby charging the capacitor 20 at its output to the supply voltage, $V_{CC}$.

The charge on the capacitor 20 not only provides the bias voltage for the p-channel transistor but also the bias voltage for the n-channel transistor. In such an arrangement, the discharge of each capacitor 20 through the n-channel transistor 18 of the preceding stage is dependent on the gate bias voltage, $V_{CC}$. Accordingly, the frequency of oscillation of the circuit depends not only on the number of stages in the ring but also on the voltage of $V_{CC}$. That is, as $V_{CC}$ increases in voltage, the frequency of oscillation increases, and conversely when the voltage of $V_{CC}$ decreases, the frequency of oscillation also decreases due to the reduced discharge of each capacitor.

In accordance with the present invention, a CMOS ring oscillator circuit is provided in which the frequency of oscillation is dependent upon the number of stages in the ring oscillator but is relatively independent of the supply voltage, $V_{CC}$.

FIG. 3 is a schematic of one embodiment of the invention in which each stage comprises a CMOS transistor pair 26, 28, similar to the circuitry of FIG. 2. Capacitor 30 shunts the output of each stage as does the capacitor 20 in FIG. 2. However, in this embodiment, while each of the gate terminals of the p-channel transistors is connected to the output of the preceding stage, the gate of the n-channel transistor is connected to a fixed reference voltage, $V_{REF}$, which is set at approximately $2V_T + \Delta V$. $V_{REF}$ can be any value between the threshold voltage of the n-channel transistor and the minimum value of $V_{CC}$. With this arrangement, the voltage of each capacitor 30 Will charge to $V_{CC}$, as does the circuit of FIG. 2, but the conduction of the succeeding stage depends solely on the discharge of the capacitor 30 by an amount of $V_T$ of the p-channel device of the succeeding stage, which depends on the conduction of the n-channel transistor 28. Since the gate bias of the n-channel transistor 28 is independent of $V_{CC}$, the discharge of the capacitor 30 is likewise independent of $V_{CC}$. Accordingly, while the maximum charge on each capacitor 30 can vary as the supply voltage, $V_{CC}$, varies, the conduction of the p-channel transistor of the succeeding stage depends on the discharge of the capacitor through the n-channel transistor of the preceding stage which is independent of $V_{CC}$. $V_{CC}$ effect on transistor $V_T$ is eliminated by using long p-channel and n-channel transistors. Thus the discharge of the capacitor 30 through the n-channel transistor 26 and the turning on of the next stage p-channel transistor are both independent of $V_{CC}$.

In one embodiment of the invention, the channel dimensions of the p-channel transistor was 80 microns in width by 5 microns in length, while the dimensions of the channel of the n-channel transistor was 6 microns by 6 microns. Gate oxide thickness was approximately 350 A, and the capacitor dimensions were 20 microns by 20 microns. In an 11-stage ring oscillator with this configuration, the supply voltage $V_{CC}$ was varied between 2.0 volts and 7.5 volts. The period in microseconds at 25° C. varied from 0.66 to 0.69. Thus, while a conventional CMOS ring oscillator would vary in frequency by a ratio of 3.5 with this variation in $V_{CC}$, the frequency of oscillation remained substantially constant using the circuitry in accordance with the invention.

There has been described an improved CMOS transistor ring oscillator circuit in which the frequency of oscillation is relatively independent of supply voltage. While the invention has been described with reference to a specific embodiment, the description is illustrative of the invention and is not to be construed as limiting the invention. For example, while the preferred embodiment includes separate capacitors 30, the capacitance of the gate structure of the succeeding p-channel transistor, alone or with the circuit stray capacitance, can suffice. Thus, various modifications and applications may occur to those skilled in the art without departing from the true spirit and scope of the invention as defined by the appended claims.

We claim:

1. A ring oscillator comprising an odd number of serially connected inverter stages, each stage including a p-channel transistor serially connected with an n-channel transistor between a first voltage potential ($V_{CC}$) and a second voltage potential (ground) and with the common terminal of the serially connected transistor being an output, means connecting the output of one stage with the gate terminal of the p-channel transistor in the succeeding stage, capacitive means connected to each output, a reference voltage ($V_{REF}$) connected to the gate of each n-channel transistor whereby the discharge of the capacitor means of a preceding stage is relatively independent of the first voltage potential ($V_{CC}$).

2. The ring oscillator as defined by claim 1 wherein said capacitive means comprises a capacitor connected between each output and the second voltage potential.

3. The ring oscillator as defined by claim 1 wherein said capacitive means comprises the gate structure of the succeeding p-channel transistor.

4. The ring oscillator as defined by claim 1 wherein the width-to-length ratio of each p-channel transistor is greater than the width-to-length ratio of each n-channel transistor.

5. The ring oscillator as defined by claim 4 wherein the channel of each p-channel transistor has a width of 80 microns and a length of 5 microns, and the channel of each n-channel transistor has a width of 6 microns and a length of 6 microns.

6. The ring oscillator as defined by claim 5 wherein the gate oxide for the n-channel transistors and p-channel transistors is on the order of 350 A and the capacitor plate dimensions are 20 microns by 20 microns.

7. The ring oscillator as defined by claim 1 wherein said reference voltage is between a minimum value of said first voltage potential and the threshold voltage of said n-channel transistors.

* * * * *